(12) United States Patent
Ma

(10) Patent No.: US 12,605,623 B2
(45) Date of Patent: Apr. 21, 2026

(54) GAMEPAD AND COOLING METHOD THEREFOR

(71) Applicant: GUANGZHOU CHICKEN RUN NETWORK TECHNOLOGY CO., LTD., Guangzhou (CN)

(72) Inventor: Yao Ma, Guangzhou (CN)

(73) Assignee: GUANGZHOU CHICKEN RUN NETWORK TECHNOLOGY CO., LTD., Guangzhou (CN)

( * ) Notice: Subject to any disclaimer, the term of this patent is extended or adjusted under 35 U.S.C. 154(b) by 320 days.

(21) Appl. No.: 18/550,951

(22) PCT Filed: Jun. 30, 2022

(86) PCT No.: PCT/CN2022/102634
§ 371 (c)(1),
(2) Date: Sep. 15, 2023

(87) PCT Pub. No.: WO2023/071269
PCT Pub. Date: May 4, 2023

(65) Prior Publication Data
US 2024/0050845 A1     Feb. 15, 2024

(30) Foreign Application Priority Data

Oct. 27, 2021    (CN) .......................... 202111253573.1

(51) Int. Cl.
*A63F 13/24*          (2014.01)
*A63F 13/98*          (2014.01)
*H05K 7/20*          (2006.01)
(52) U.S. Cl.
CPC .............. *A63F 13/24* (2014.09); *A63F 13/98* (2014.09); *H05K 7/20136* (2013.01); *H05K 7/2039* (2013.01)

(58) Field of Classification Search
CPC .......... A63F 13/24; A63F 13/98; A63F 13/92; H05K 7/20136; H05K 7/2039; H05K 7/20;
(Continued)

(56) References Cited

U.S. PATENT DOCUMENTS 6,530,838 B2 * 3/2003 Ha .......................... A63F 13/24
345/169
7,465,257 B1 * 12/2008 Morgan, Jr. ............ A63F 13/33
434/257
(Continued)

FOREIGN PATENT DOCUMENTS

| CN | 205412193 U | 8/2016 |
| CN | 207493190 U | 6/2018 |

(Continued)

OTHER PUBLICATIONS

PCT/CN2022/102634, international report on patentability, downloaded from wipo.int, Sep. 20, 2025.*

(Continued)

*Primary Examiner* — David L Lewis
*Assistant Examiner* — Matthew D Hoel
(74) *Attorney, Agent, or Firm* — Hunton Andrews Kurth LLP

(57) ABSTRACT

Provided are a gamepad and a cooling method thereof, which relate to the technical field of electronic gaming devices. The gamepad includes a gamepad body, a cooling assembly, and a power interface. A main PCB and a cooling PCB that are selectively electrically connected to each other are disposed in the gamepad body, the gamepad does not include a power supply apparatus, and the main PCB is selectively electrically connected to an external electronic device. The cooling assembly is electrically connected to the cooling PCB.

16 Claims, 2 Drawing Sheets

(58) Field of Classification Search

CPC ............... H05K 1/145; H05K 7/20145; H05K 7/20209; Y02D 10/00; G06F 1/203

See application file for complete search history.

(56) References Cited

U.S. PATENT DOCUMENTS

| | | | | |
|---|---|---|---|---|
| 2002/0155890 A1* | 10/2002 | Ha | A63F 13/23 | |
| | | | | 463/36 |
| 2005/0269769 A1* | 12/2005 | Naghi | A63F 13/24 | |
| | | | | 463/36 |
| 2005/0275165 A1* | 12/2005 | Hussaini | A63F 13/24 | |
| | | | | 273/148 B |
| 2006/0178211 A1* | 8/2006 | Chien | A63F 13/24 | |
| | | | | 341/20 |
| 2009/0002365 A1* | 1/2009 | Kurabayashi | G06T 15/00 | |
| | | | | 345/647 |
| 2009/0093314 A1* | 4/2009 | Ichikawa | A63F 13/10 | |
| | | | | 463/16 |
| 2009/0156307 A1* | 6/2009 | Aguirre | A63F 13/50 | |
| | | | | 463/38 |
| 2010/0105478 A1* | 4/2010 | Hallaian | A63F 9/0079 | |
| | | | | 463/36 |
| 2012/0040762 A1* | 2/2012 | Shinjo | A63F 13/95 | |
| | | | | 463/42 |
| 2012/0258800 A1* | 10/2012 | Mikhailov | A63F 13/285 | |
| | | | | 463/36 |
| 2013/0095925 A1* | 4/2013 | Xu | G06F 1/206 | |
| | | | | 463/37 |
| 2014/0349730 A1* | 11/2014 | Sugai | G07F 17/329 | |
| | | | | 463/17 |
| 2015/0187167 A1* | 7/2015 | Faul | A63F 13/285 | |
| | | | | 463/31 |
| 2015/0290533 A1* | 10/2015 | Cerqueira | A63F 13/215 | |
| | | | | 463/35 |
| 2017/0100665 A1* | 4/2017 | Jaouen | A63F 13/217 | |
| 2018/0071627 A1* | 3/2018 | Ono | A63F 13/214 | |
| 2018/0075799 A1* | 3/2018 | Ono | G09G 3/32 | |
| 2018/0147484 A1* | 5/2018 | Osawa | A61L 9/122 | |
| 2018/0350190 A1* | 12/2018 | Wen | G07F 17/3216 | |
| 2020/0078670 A1* | 3/2020 | Oh | H05K 7/20172 | |
| 2020/0111451 A1* | 4/2020 | Francies, III | A63F 13/5255 | |
| 2020/0217574 A1 | 7/2020 | Thelin et al. | | |
| 2021/0038977 A1* | 2/2021 | Dixon | A63F 13/92 | |
| 2021/0362047 A1* | 11/2021 | Farrell, Jr. | A63F 13/27 | |
| 2022/0193536 A1* | 6/2022 | Aurongzeb | A63F 13/533 | |
| 2022/0413614 A1* | 12/2022 | Gilg | G06F 40/221 | |
| 2023/0149805 A1* | 5/2023 | Argiro | A63F 13/428 | |
| | | | | 463/31 |
| 2023/0289194 A1* | 9/2023 | Colenbrander | G06F 9/4406 | |
| 2023/0386159 A1* | 11/2023 | Gilg | A63F 13/26 | |
| 2024/0115962 A1* | 4/2024 | Alahgholipouromrani | | |
| | | | | A63F 13/24 |

FOREIGN PATENT DOCUMENTS

| | | | | | |
|---|---|---|---|---|---|
| CN | 208852390 U | | 5/2019 | | |
| CN | 209204625 U | | 8/2019 | | |
| CN | 209422933 U | | 9/2019 | | |
| CN | 209548677 U | | 10/2019 | | |
| CN | 209771306 U | | 12/2019 | | |
| CN | 209952214 U | * | 1/2020 | ............. A63F 13/20 |
| CN | 210302358 U | | 4/2020 | | |
| CN | 210384817 U | | 4/2020 | | |
| CN | 112240460 A | | 1/2021 | | |
| CN | 212575611 U | * | 2/2021 | ............. A63F 13/24 |
| CN | 212876471 U | | 4/2021 | | |
| CN | 212998341 U | | 4/2021 | | |
| CN | 213760479 U | | 7/2021 | | |
| CN | 114007383 A | | 2/2022 | | |

OTHER PUBLICATIONS

PCT/CN2022/102634, written opinion, downloaded from wipo.int, Sep. 20, 2025.*

PCT/CN2022/102634, international search report, downloaded from wipo.int, Sep. 20, 2025.*

Machine translation of CN 209952214 U, downloaded from espacenet. com, Sep. 20, 2025.*

Machine translation of CN 212575611 U, downloaded from espacenet. com, Sep. 20, 2025.*

First Office Action, issued in JP Application No. 2023-555208 on Aug. 20, 2024, 12 pages.

First Chinese Office Action, issued from The State Intellectual Property Office of People's Republic of China, issued to CN Application No. 202111253573.1, Mar. 10, 2023, 10 pages.

R. Grimes, E. Walsh, P. Walsh, "Active Cooling Of A Mobile Phone Handset," Applied Thermal Engineering (2010), doi: 10.1016/j. applthermaleng.2010.06.002, Jun. 1, 2010, 25 pages.

International Search Report, issued from the International Search Authority, to International Application No. PCT/CN2022/102634, mailed on Dec. 29, 2022, 6 pages.

* cited by examiner

GAMEPAD AND COOLING METHOD THEREFOR

CROSS-REFERENCE TO RELATED APPLICATION

This is a National stage application, filed under 35 U.S.C. 371, of International Patent Application NO. PCT/CN2022/ 102634, filed on Jun. 30, 2022, which is based on and claims priority to Chinese Patent Application No. 202111253573.1 filed with the China National Intellectual Property Administration (CNIPA) on Oct. 27, 2021, the disclosure of which is incorporated herein by reference in its entirety.

TECHNICAL FIELD

The present disclosure relates to the technical field of electronic gaming devices, for example, a gamepad and a cooling method thereof.

BACKGROUND

At present, with the improvement of people's living standards, mobile phones are widely used in people's daily lives. With the development of smartphones, the mobile phones are not only an important tool for people to communicate, but also an important platform for people to play games. Gamepads can be used for supporting the mobile phones so that people feel more comfortable during operation.

In the related art, most gamepads does not have a heat dissipation apparatus. Part of gamepads with a heat dissipation effect are each integrated with a heat dissipation apparatus. However, at the same time, a power supply needs to be integrated in a grip of the gamepad to power the heat dissipation apparatus, resulting in the heavy weight and high cost of the gamepad. In addition, the grip of the gamepad with the heat dissipation apparatus only has partial mechanical functions. Keys are controlled, with a mechanical principle (such as the lever principle), to work, and mechanical transmission results in relatively poor sensitivity and stability and a serious delay problem.

SUMMARY

The present disclosure provides a gamepad and a cooling method thereof, where the gamepad has a light weight, low cost, a good cooling effect, and long service time.

The present disclosure adopts the technical solutions described below.

A gamepad includes a gamepad body, a cooling assembly, and a power interface.

A main printed circuit board (PCB) and a cooling PCB that are selectively electrically connected to each other are disposed in the gamepad body, the gamepad does not include a power supply apparatus, and the main PCB is selectively electrically connected to an external electronic device.

The cooling assembly is electrically connected to the cooling PCB.

The power interface is electrically connected to the main PCB, and is selectively electrically connected to an external power supply, where only in response to the external electronic device being electrically connected to the main PCB and the external power supply being electrically connected to the power interface, the main PCB is electrically connected to the cooling PCB to cool the external electronic device.

Figure 1:
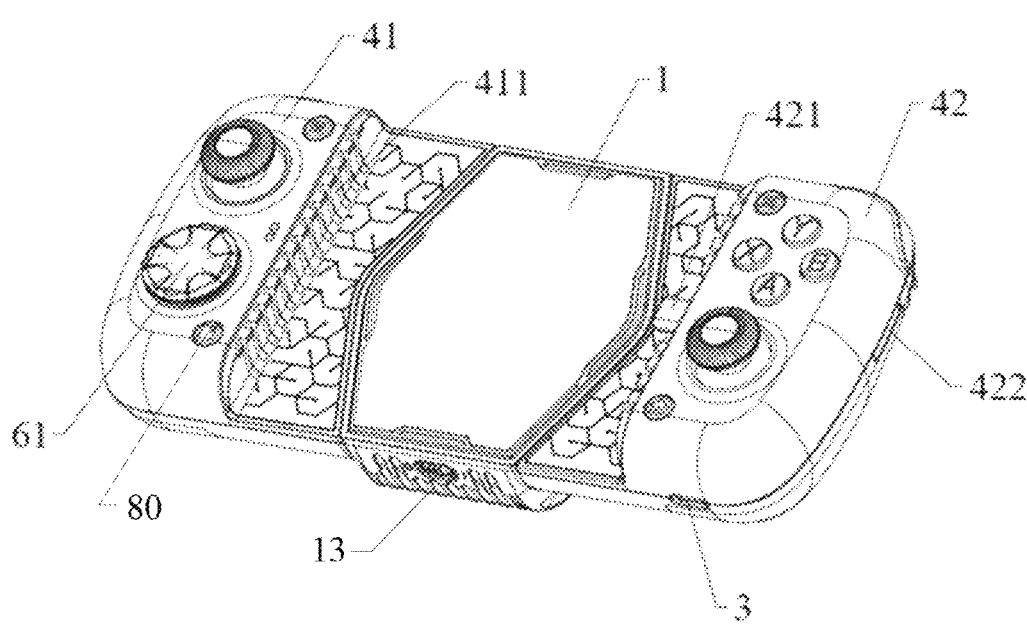
FIG. 1 is a schematic view of a gamepad according to an embodiment of the present disclosure.

REFERENCE LIST 1 gamepad body
11 cooling portion
12 connection portion
13 cooling switch
121 positioning column
2 cooling assembly
21 heat sink
22 heat dissipation column
23 cooling fan
24 thermoelectric cooler
3 power interface
41 left grip
411 non-slip protrusion
42 right grip
421 device interface
422 TransFlash (TF) card slot
resilient conduction member
61 operating head
71 mainPCB
72 first auxiliary PCB/cooling PCB
73 second auxiliary PCB

DETAILED DESCRIPTION

Technical solutions in embodiments of the present disclosure are described in detail below in conjunction with the drawings.

Figure 2:
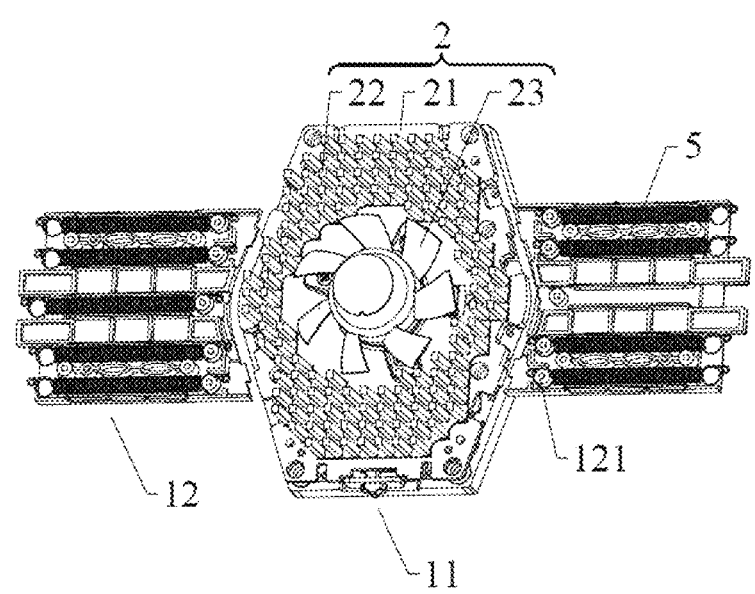
FIG. 2 is a schematic view of a gamepad body of a gamepad with a lower housing hidden and a resilient conduction member according to an embodiment of the present disclosure.
Figure 3:
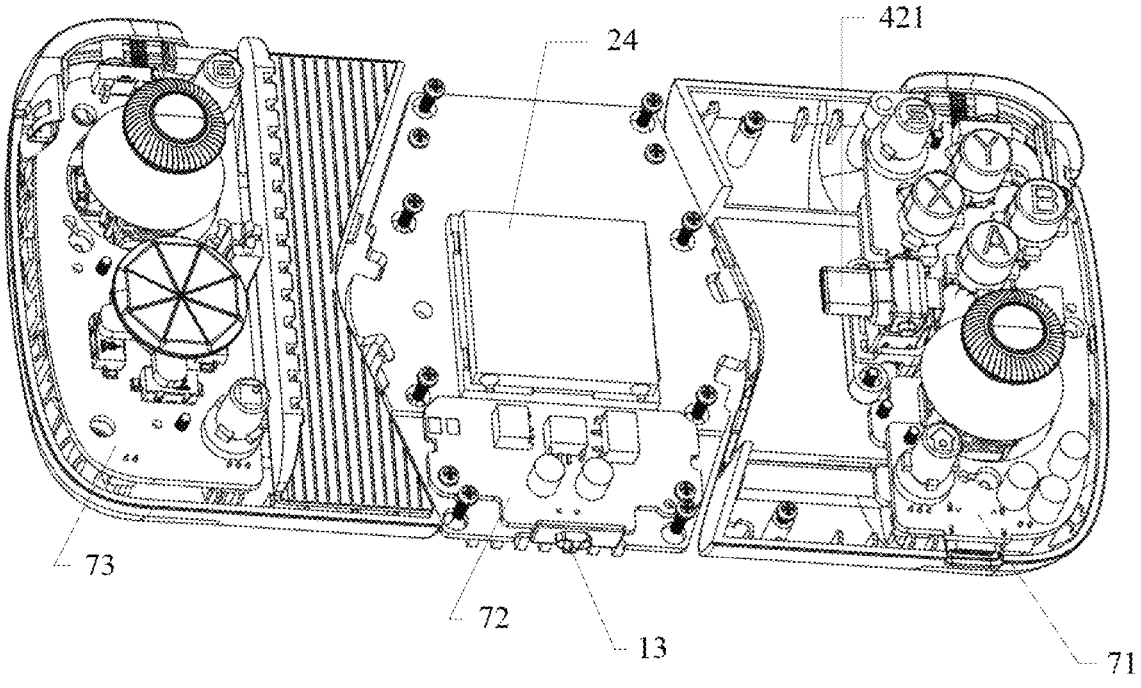
FIG. 3 is a schematic view of a gamepad according to an embodiment of the present disclosure, where elements of the gamepad, such as an upper housing and a cooling assembly, are hidden.

As shown in FIGS. 1 and 2, a gamepad is provided in this embodiment, where the gamepad includes a gamepad body 1, a cooling assembly 2, and a power interface 3. As shown in FIG. 3, a main PCB 71 and a cooling PCB 72 that are selectively electrically connected to each other are disposed in the gamepad body 1, and the gamepad does not include a power supply apparatus. The main PCB 71 is selectively electrically connected to an external electronic device. For example, the external electronic device may be a smartphone, the smartphone is electrically connected to the main PCB via a device interface 421 so that the effect is achieved that the smartphone powers the main PCB of the gamepad, and the gamepad can be used to control the smartphone at the same time. The cooling assembly 2 is electrically connected to the cooling PCB 72 and is controlled by the cooling PCB 72. The power interface 3 is electrically connected to the main PCB 71, and is selectively electrically connected to an external power supply, where only when the external electronic device is electrically connected to the main PCB 71 and the external power supply is electrically connected to the power interface 3, the main PCB 71 is electrically connected to the cooling PCB 72 to cool the external electronic device.

The cooling PCB 72 and the cooling assembly 2 electrically connected to the cooling PCB 72 are configured to cool the external electronic device when the cooling PCB 72 is powered. The power interface 3 is configured to be selectively electrically connected to the external power supply, and the main PCB 71 is configured to be selectively electrically connected to the cooling PCB 72. For example, only when the external electronic device is electrically connected to the main PCB 71 via the device interface 421 and the external power supply is electrically connected to the power interface 3, the main PCB 71 is electrically connected to the cooling PCB 72. The cooling PCB 72 is selectively electrically connected to the cooling assembly 2. When the cooling PCB 72 is electrically connected to the cooling assembly 2, the cooling PCB 72 is used for the cooling assembly 2 to cool the external electronic device. Only when the external power supply is connected, the cooling assembly 2 performs cooling, so that the gamepad can have no power supply apparatus, which reduces the weight and cost of the gamepad.

Optionally, the gamepad is further provided with a cooling switch 13 communicatively connected to the main PCB 71, where when the external electronic device is electrically connected to the main PCB 71, the external power supply is electrically connected to the power interface 3 and the cooling switch 13 is turned on, the main PCB 71 is electrically connected to the cooling PCB 72. The cooling switch 13 is provided so that when the external electronic device is electrically connected to the main PCB 71 and the external power supply is electrically connected to the power interface 3, an operator can further control, by controlling the cooling switch 13 to be turned on or off, the cooling assembly 2 to be used or not as required, so as to adapt to different use scenarios and use habits of different users.

In this embodiment, the gamepad further includes a grip, and the gamepad body 1 includes a cooling portion 11 and a connection portion 12. The cooling PCB 72 is disposed in the cooling portion 11, and the cooling switch 13 is disposed on the cooling portion 11 for a user to conveniently operate. Two sides of the cooling portion 11 are each provided with a connection portion 12 which is slidably inserted through the grip. The grip is configured to clamp the external electronic device.

Optionally, the grip includes a left grip 41 and a right grip 42 that are each slidably connected to the gamepad body 1 and are configured to clamp the external electronic device. The cooling switch 13 is disposed at the bottom of the cooling portion 11. A first auxiliary PCB 72 is disposed in the gamepad body 1, where the first auxiliary PCB 72 is also referred to as the cooling PCB 72. The main PCB 71 is disposed in the right grip 42. A second auxiliary PCB 73 is disposed in the left grip 41 and is responsible for the function of the left grip 41 to control the external electronic device. A resilient conduction member 5 is disposed between the left grip 41 and the gamepad body 1, and another resilient conduction member 5 is disposed between the right grip 42 and the gamepad body 1. The resilient conduction members 5 are configured to enable conduction between the main PCB 71 and the first auxiliary PCB 72, conduction between the main PCB 71 and the second auxiliary PCB 73, or conduction between the main PCB 71 and both the first auxiliary PCB 72 and the second auxiliary PCB 73. In addition, the resilient conduction members 5 allows the left grip 41 and the right grip 42 to have a tendency to approach each other. Optionally, in the case where the external electronic device is connected to the device interface 421 and the power interface 3 is not connected to the external power supply, the conduction between the main PCB 71 and the second auxiliary PCB 73 is implemented, and the conduction between the main PCB 71 and the first auxiliary PCB 72 is not implemented; in the case where the external electronic device is connected to the device interface 421 and the power interface 3 is connected to the external power supply, the conduction between the main PCB 71 and the second auxiliary PCB 73 is implemented, and the conduction between the main PCB 71 and the first auxiliary PCB 72 is implemented; and in the case where the external electronic device is not connected to the device interface 421 and the power interface 3 is connected to the external power supply, the conduction between the main PCB 71 and the first auxiliary PCB 72 is implemented, and the conduction between the main PCB 71 and the second auxiliary PCB 73 is not implemented.

The left grip 41 and the right grip 42 that are slidably connected to the gamepad body 1 are configured to clamp the external electronic device. A resilient conduction member 5 is disposed between the left grip 41 and the gamepad body 1, and another resilient conduction member 5 is disposed between the right grip 42 and the gamepad body 1. The resilient conduction members 5 are configured to implement the conduction between the main PCB 71 and the first auxiliary PCB 72 and the second auxiliary PCB 73. Since the main PCB 71 is electrically connected to the external electronic device, the auxiliary PCB can be powered by the main PCB 71 after the conduction is implemented. Thus, the gamepad can implement corresponding game functions without a power supply apparatus, which reduces the weight and cost of the gamepad. In addition, operation functions of the left grip 41 and the right grip 42 are ensured, and further, gaming experience is ensured. In addition, the resilient conduction members 5 can also allow the left grip 41 and the right grip 42 that are slidable to have the tendency to approach each other so that it is ensured that the external electronic device is effectively clamped. That is to say, in the gamepad in the embodiment of the present invention, the integrated design of the gamepad body and the cooling assembly is implemented. The external electronic device clamped by the left grip and the right grip is used while the cooling assembly is used. In the manner of dual power supply, the technical effect is achieved that controlling and cooling of the external electronic device is achieved at the same time.

It is to be understood that the gamepad body 1 and the grips are each provided with a housing, where to implement the slidable connection between the left grip 41 and the gamepad body 1, a first end of the resilient conduction member 5 is sleeved on an end of an upper housing of a connection portion 12 on the left side of the cooling portion 11, the end facing the cooling portion 11; a second end of the resilient conduction member 5 is sleeved on an end of a lower housing of the left grip 41, the end facing away from the right grip 42; and the slidable connection between the right grip 42 and the gamepad body 1 is the same, which is not repeated here.

For example, the upper housing of the connection portion 12 and the lower housing of the grip are each provided with a positioning column 121. The resilient conduction member 5 is a spring, and the slide of the grip relative to the gamepad body 1 is implemented through the stretching of the spring, which has a simple structure and is not easily damaged. When the spring is mounted, two ends of the spring are sleeved on the positioning columns on the upper housing of the connection portion 12 and the lower housing of the grip respectively. Exemplarily, the spring may be fixed by screws, that is, the screws are used for limiting the spring, which causes the spring to be mounted more reliably. The resilient conduction member 5 can implement the connection to a respective PCB.

As a solution of the gamepad, the device interface is disposed on the grip and pluggably connected to the external electronic device so that the external electronic device is selectively electrically connected to the main PCB. Optionally, to implement the electrical connection between the main PCB and the external electronic device, the device interface 421 is disposed on the right grip 42, the device interface 421 is electrically connected to the main PCB, and the external electronic device is pluggably connected to the device interface 421, which implements a plug-and-play function and convenient use and has no delay to be felt. Thus, the gaming experience is better improved. When the external electronic device is plugged into the device interface 421, the external electronic device can power the main PCB 71 and further power the auxiliary PCB. It is noted that the main PCB 71 may be disposed in the left grip 41, correspondingly, the device interface 421 is also disposed in the left grip 41, and the second auxiliary PCB is disposed in the right grip 42, so as to facilitate the electrical connection of the device interface 421 to the main PCB.

Exemplarily, the device interface 421 extends along a direction in which the left grip 41 and the right grip 42 slide so that when the external electronic device is clamped by the left grip 41 and the right grip 42, the external electronic device is plugged into the device interface 421. Thus, the operation is convenient, and a stress between the clamped external electronic device and the device interface 421 is reduced, thereby prolonging the service life of the gamepad. Exemplarily, the device interface 421 is configured to float with the left grip 41 or the right grip 42 to adapt to external electronic devices of different thicknesses. Exemplarily, the device interface 421 is detachably connected to the left grip 41 or the right grip 42, which facilitates selection according to interfaces of different external electronic devices and improves the versatility of the gamepad.

Optionally, the power interface 3 is disposed in the grip such that the external power supply is connected to a side of the grip, which reduces the influence on the user operating the gamepad after the external power supply is connected, thereby making the operation of the gamepad smoother.

Optionally, an end of the left grip 41 facing the right grip 42 and an end of the right grip 42 facing the left grip 41 each include multiple spaced non-slip protrusions 411. When the left grip 41 and the right grip 42 clamp the external electronic device, the non-slip protrusions 411 abut against sides of the external electronic device, thereby effectively ensuring clamping reliability. In addition, since the multiple non-slip protrusions 411 are spaced, a microphone and the like of the external electronic device can be prevented from being squeezed so that smooth sound transmission during use is ensured, while the clamping reliability is ensured. Exemplarily, the non-slip protrusions 411 are made of silica gel with a good non-slip effect. Exemplarily, an inverse clip is disposed at an end of the non-slip protrusion 411 facing away from a plane where the external electronic device is placed, which stabilizes the external electronic device and prevents the external electronic device from slipping.

Optionally, a guide slot is disposed in the connection portion 12 or the grip, where the resilient conduction member 5 is disposed in the guide slot. The guide slot is provided, which is conducive to guiding the stretch and retraction of the resilient conduction member 5.

Optionally, an end of the left grip 41 facing away from the right grip 42 and an end of the right grip 42 facing away from the left grip 41 are each provided with a stopper, and correspondingly, a concave-convex rib is disposed at an end of the connection portion 12 facing away from the cooling portion 11, where the concave portion of the rib is used for avoiding a positioning column on the lower housing of the grip, and the convex portion of the rib is used for abutting against the stopper to limit a slide position between the grip and the gamepad body 1.

Optionally, the cooling assembly 2 includes a thermoelectric cooler 24 and a heat sink 21 on a side of the thermoelectric cooler 24 facing away from the external electronic device, and the thermoelectric cooler 24 is electrically connected to the cooling PCB 72. The thermoelectric cooler 24 electrically connected to the cooling PCB 72 is provided so that when the thermoelectric cooler 24 is powered by the cooling PCB 72, the cooling assembly 2 can cool the external electronic device, thereby avoiding the influence of the use of the external electronic device due to overheat of the external electronic device in use. The heat sink 21 is configured to dissipate heat of the thermoelectric cooler 24 to an end of the thermoelectric cooler 24 facing away from the external electronic device, thereby implementing the heat dissipation of the thermoelectric cooler 24 and reducing the influence on the external electronic device. Exemplarily, multiple heat dissipation columns 22 are spaced on a side of the heat sink 21 facing away from the thermoelectric cooler 24 to improve the heat dissipation effect.

Optionally, the cooling assembly 2 further includes red copper disposed on a side of the thermoelectric cooler 24 facing the external electronic device, where the red copper is configured to improve the heat conduction between the external electronic device and the thermoelectric cooler 24. In addition, a silica gel copper mold is disposed on a side of an upper housing of the cooling portion 11 in contact with the external electronic device and is also configured to speed up the heat dissipation from the external electronic device to the thermoelectric cooler 24 to improve the heat dissipation effect. The silica gel copper mold and the copper can quickly increase a cooling surface to improve the heat dissipation effect.

Optionally, the cooling assembly 2 further includes a cooling fan 23 on the side of the heat sink 21 facing away from the thermoelectric cooler 24, and the cooling fan 23 is electrically connected to the cooling PCB 72. Exemplarily, the cooling fan 23 is disposed among the multiple heat dissipation columns 22, and when the cooling PCB 72 is powered by the main PCB 71, the cooling fan 23 is also powered to rotate so that the heat dissipation effect of the heat sink 21 is improved.

In this embodiment, a lower housing of the cooling portion 11 is hollowed-out so that heat dissipated by the heat dissipation columns 22 and the cooling fan 23 can be discharged from the gamepad as soon as possible. Exemplarily, an effect light is disposed on the cooling fan 23, and the effect light is electrically connected to the main PCB 71 through the cooling PCB 72. When the cooling fan 23 is powered by the main PCB 71, the effect light may be powered selectively and synchronously by the cooling PCB, and the effect light can flash or change colors to match game scenes, which makes the user experience of the gamepad better.

Optionally, to increase a memory of the gamepad, the gamepad further includes a TF card slot 422, and the TF card slot 422 is communicatively connected to the main PCB, which facilitates the improvement of the gaming experience when the external electronic device is used for playing games. Exemplarily, the TF card slot 422 is disposed on a side of the right grip 42 facing away from the left grip 41, and a flip-top lid is further disposed on the TF card slot 422 to prevent dust from entering the TF card slot 422 so as to ensure the normal use of the TF card slot 422.

Exemplarily, to improve the operation performance of the gamepad, an operating assembly is disposed on the grip. The operating assembly includes an operating head 61 and a connection member, where the connection member is disposed on the grip, and the operating head 61 and the connection member are connected to each other through magnetic attraction. The connection through the magnetic attraction is reliable. The operating head 61 may be configured to be in different forms according to operation needs of the gamepad and the user's preferences and operation habits, such as a button type, a crank type, or different heights or shapes. Then, the operating head is replaced at any time, which is convenient to replace and provides good user experience. With the design of the magnetic attraction, different operating heads 61 are connectable to the connection member according to needs so that the height, touch, and shape of the operating head 61 are changed.

Exemplarily, to facilitate the convenience of operations of the gamepad during use, function keys are disposed above the grip, and the function keys are each communicatively connected to the main PCB, which facilitates the control of the operation of the external electronic device. Exemplarily, as shown in FIG. 1, the left grip 41 is provided with two function keys 80, the right grip 42 is provided with two function keys 80, and functions of the function keys may be configured by those skilled in the art according to actual needs.

In this embodiment, a gamepad cooling method applied to the gamepad according to any one of the preceding solutions is further provided. The gamepad cooling method includes: electrically connecting an external electronic device to a main PCB 71, electrically connecting an external power supply to a power interface 3, and cooling, by a cooling assembly 2, the external electronic device. The case is avoided where the external electronic device is used to power the cooling assembly 2, which reduces the power consumption of the external electronic device.

Optionally, to adapt to more use scenarios and the use habits of different users, after the external electronic device is electrically connected to the main PCB 71 and the external power supply is electrically connected to the power interface 3, and before the cooling assembly 2 cools the external electronic device, the method further includes: turning on a cooling switch. After the external electronic device is electrically connected to the main PCB 71, and the external power supply is electrically connected to the power interface 3, the user controls, by controlling the cooling switch to be turned on or off, the cooling assembly 2 to work, which makes the cooling more targeted.

Optionally, when the external electronic device is electrically connected to the main PCB via the device interface 421 and the external power supply is connected to the gamepad via the power interface 3, the external power supply can charge the external electronic device.

In the description of the present disclosure, it is to be noted that orientations or position relations indicated by terms such as "center", "upper", "lower", "left", "right", "vertical", "horizontal", "in", and "out" are based on the drawings. These orientations or position relations are intended only to facilitate and simplify the description of the present disclosure and not to indicate or imply that a device or element referred to must have such particular orientations or must be configured or operated in such particular orientations. Thus, these orientations or position relations are not to be construed as limiting the present disclosure. In addition, terms such as "first" and "second" are used only for the purpose of description and are not to be construed as indicating or implying relative importance. Terms "first position" and "second position" are two different positions.

In the description of the present disclosure, it is to be noted that unless otherwise expressly specified and limited, terms "mounted", "connected to each other", and "connected" are to be understood in a broad sense as "securely connected", "detachably connected", or "integrally connected"; "mechanically connected" or "electrically connected"; "directly connected to each other" or "indirectly connected to each other via an intermediary"; or "intraconnected between two components". For those of ordinary skill in the art, specific meanings of the preceding terms in the present disclosure may be understood based on specific situations.

What is claimed is:

1. A gamepad, comprising:
a gamepad body, wherein a main printed circuit board (PCB) and a cooling PCB that are selectively electrically connected to each other are disposed in the gamepad body, the gamepad does not comprise a power supply apparatus, and the main PCB is selectively electrically connected to an external electronic device;
a cooling assembly electrically connected to the cooling PCB;
a power interface electrically connected to the main PCB and selectively electrically connected to an external power supply, wherein only in response to the main PCB being electrically connected to the external electronic device and the power interface being electrically connected to the external power supply, the main PCB is electrically connected to the cooling PCB to cool the external electronic device;
a grip, wherein the grip comprises a left grip and a right grip that are each slidably connected to the gamepad body and are configured to clamp the external electronic device; the main PCB is disposed in the right grip, and a second auxiliary PCB is disposed in the left grip; and
two resilient conduction members, wherein one of the two resilient conduction members is disposed between the left grip and the gamepad body, and the other one of the two resilient conduction members is disposed between the right grip and the gamepad body; and wherein the two resilient conduction members are configured to enable conduction between the main PCB and at least one of the cooling PCB or the second auxiliary PCB, and to allow the left grip and the right grip to have a tendency to approach each other.

2. The gamepad according to claim 1, further comprising a cooling switch communicatively connected to the main PCB, wherein in response to the main PCB being electrically connected to the external electronic device, the power interface being electrically connected to the external power supply, and the cooling switch being turned on, the main PCB is electrically connected to the cooling PCB.

3. The gamepad according to claim 2, wherein the gamepad body comprises:
a cooling portion, wherein the cooling PCB is disposed in the cooling portion, and the cooling switch is disposed on the cooling portion; and
connection portions, wherein the connection portions are disposed on two sides of the cooling portion and slidably inserted through the grip.

4. The gamepad according to claim 3, wherein a device interface is disposed on the grip and pluggably connected to the external electronic device so that the main PCB is selectively electrically connected to the external electronic device.

5. The gamepad according to claim 3, wherein the power interface is disposed on the grip.

6. The gamepad according to claim 1, wherein the cooling assembly comprises a thermoelectric cooler and a heat sink on a side of the thermoelectric cooler facing away from the external electronic device, and the thermoelectric cooler is electrically connected to the cooling PCB.

7. The gamepad according to claim 6, wherein the cooling assembly further comprises a cooling fan on a side of the heat sink facing away from the thermoelectric cooler, and the cooling fan is electrically connected to the cooling PCB.

8. A gamepad cooling method, applied to a gamepad, wherein the gamepad comprises:

a gamepad body, wherein a main printed circuit board (PCB) and a cooling PCB that are selectively electrically connected to each other are disposed in the gamepad body, the gamepad does not comprise a power supply apparatus, and the main PCB is selectively electrically connected to an external electronic device;

a cooling assembly electrically connected to the cooling PCB;

a power interface electrically connected to the main PCB and selectively electrically connected to an external power supply, wherein only in response to the main PCB being electrically connected to the external electronic device and the power interface being electrically connected to the external power supply, the main PCB is electrically connected to the cooling PCB to cool the external electronic device;

a grip, wherein the grip comprises a left grip and a right grip that are each slidably connected to the gamepad body and are configured to clamp the external electronic device; the main PCB is disposed in the right grip, and a second auxiliary PCB is disposed in the left grip; and two resilient conduction members, wherein one of the two resilient conduction members is disposed between the left grip and the gamepad body, and the other one of the two resilient conduction members is disposed between the right grip and the gamepad body; and wherein the two resilient conduction members are configured to enable conduction between the main PCB and at least one of the cooling PCB or the second auxiliary PCB, and to allow the left grip and the right grip to have a tendency to approach each other, wherein the gamepad cooling method comprises:

electrically connecting the external electronic device to the main PCB, electrically connecting the external power supply to the power interface, and cooling, by the cooling assembly, the external electronic device.

9. The gamepad cooling method according to claim 8, wherein after electrically connecting the main PCB to the external electronic device and electrically connecting the power interface to the external power supply and before cooling, by the cooling assembly, the external electronic device, the method further comprises: turning on a cooling switch.

10. The gamepad according to claim 1, wherein guide slots are disposed in the connection portions or the grip, where the two resilient conduction members are disposed in the guide slots.

11. The gamepad according to claim 7, wherein an effect light is disposed on the cooling fan 23, and the effect light is electrically connected to the main PCB 71 through the cooling PCB 72.

12. The gamepad according to claim 1, further comprising a TransFlash (TF) card slot communicatively connected to the main PCB.

13. The gamepad according to claim 1, wherein an end of the left grip facing the right grip and an end of the right grip facing the left grip each comprise a plurality of spaced non-slip protrusions.

14. The gamepad according to claim 3, wherein an operating assembly is disposed on the grip, wherein the operating assembly comprises an operating head and a connection member, the connection member is disposed on the grip, and the operating head and the connection member are connected to each other through magnetic attraction.

15. The gamepad cooling method according to claim 8, wherein the gamepad further comprises a cooling switch communicatively connected to the main PCB, wherein in response to the main PCB being electrically connected to the external electronic device, the power interface being electrically connected to the external power supply, and the cooling switch being turned on, the main PCB is electrically connected to the cooling PCB.

16. The gamepad cooling method according to claim 15, wherein the gamepad body comprises:

a cooling portion, wherein the cooling PCB is disposed in the cooling portion, and the cooling switch is disposed on the cooling portion; and connection portions, wherein the connection portions are disposed on two sides of the cooling portion and slidably inserted through the grip.

* * * * *